United States Patent
Miyazaki et al.

(10) Patent No.: US 10,884,334 B2
(45) Date of Patent: Jan. 5, 2021

(54) PHOTOCURABLE RESIN COMPOSITION

(71) Applicant: TOKUYAMA CORPORATION, Shunan (JP)

(72) Inventors: Masayuki Miyazaki, Shunan (JP); Junji Momoda, Shunan (JP); Junji Takenaka, Shunan (JP); Takashi Tamukai, Shunan (JP)

(73) Assignee: TOKUYAMA CORPORATION, Shunan (JP)

( * ) Notice: Subject to any disclaimer, the term of this patent is extended or adjusted under 35 U.S.C. 154(b) by 187 days.

(21) Appl. No.: 15/772,641

(22) PCT Filed: Nov. 10, 2016

(86) PCT No.: PCT/JP2016/084018
§ 371 (c)(1),
(2) Date: May 1, 2018

(87) PCT Pub. No.: WO2017/082432
PCT Pub. Date: May 18, 2017

(65) Prior Publication Data
US 2018/0321588 A1    Nov. 8, 2018

(30) Foreign Application Priority Data

Nov. 13, 2015 (JP) .................................. 2015-223046
Jun. 15, 2016 (JP) .................................. 2016-119119

(51) Int. Cl.

| | | |
|---|---|---|
| *G03F 7/031* | (2006.01) | |
| *G03F 7/027* | (2006.01) | |
| *B32B 27/30* | (2006.01) | |
| *C08F 2/48* | (2006.01) | |
| *G02B 1/04* | (2006.01) | |
| *C08F 222/10* | (2006.01) | |
| *C08F 2/38* | (2006.01) | |
| *C08F 226/02* | (2006.01) | |
| *C08L 33/12* | (2006.01) | |
| *G03F 7/033* | (2006.01) | |
| *C08K 5/3435* | (2006.01) | |

(52) U.S. Cl.
CPC .............. *G03F 7/031* (2013.01); *B32B 27/30* (2013.01); *C08F 2/38* (2013.01); *C08F 2/48* (2013.01); *C08F 222/10* (2013.01); *C08F 226/02* (2013.01); *C08L 33/12* (2013.01); *G02B 1/04* (2013.01); *G03F 7/027* (2013.01); *G03F 7/033* (2013.01); *C08K 5/3435* (2013.01)

(58) Field of Classification Search
CPC ......... G03F 7/0033; G03F 7/031; G03F 7/027
See application file for complete search history.

(56) References Cited

U.S. PATENT DOCUMENTS

| | | | |
|---|---|---|---|
| 6,204,306 B1 | 3/2001 | Chabrecek et al. | |
| 2001/0031427 A1* | 10/2001 | Wu ........................ | G02B 1/045 430/321 |
| 2006/0287408 A1* | 12/2006 | Baikerikar ............ | C03C 17/007 522/71 |
| 2013/0015416 A1 | 1/2013 | Takenaka et al. | |

FOREIGN PATENT DOCUMENTS

| | | |
|---|---|---|
| JP | 53-43553 A | 11/1978 |
| JP | 57-20968 B2 | 5/1982 |
| JP | 6-145274 A | 5/1994 |
| JP | 8-134156 A | 5/1996 |
| JP | 11-323186 A | 11/1999 |
| JP | 2002-318453 A | 10/2002 |
| JP | 2002-327031 A | 11/2002 |
| JP | 2007-138084 A | 6/2007 |
| JP | 2009-196202 A | 9/2009 |
| JP | 2009-256447 A | 11/2009 |
| JP | 2010-95569 A | 4/2010 |
| JP | 2011-131410 A | 7/2011 |
| JP | WO 2011/125956 A1 | 10/2011 |
| JP | 2012-42911 A | 3/2012 |
| JP | 2012-93418 A | 5/2012 |
| JP | 2015-108115 A | 6/2015 |
| WO | WO 2013/066606 A1 | 5/2013 |

OTHER PUBLICATIONS

Notification of Transmittal of Translation of the International Preliminary Report on Patentability; International Preliminary Report on Patentability, dated May 17, 2018 (Form PCT/IPEA/409).
Extended European Search Report dated May 9, 2019, for corresponding European Patent Application No. 16864393.0.
International Preliminary Report on patentability for PCT/JP2016/084018 (PCT/IPEA/409) dated Sep. 15, 2017.
International Search Report for PCT/JP2016/084018 dated Jan. 24, 2017.
Written Opinion of the International Searching Authority for PCT/JP2016/084018 (PCT/ISA/237) dated Jan. 24, 2017.
Japanese Notice of Reasons for Refusal dated Jun. 23, 2020, for corresponding Japanese Application No. 2017-550437, with English translation.
Japanese Office Action dated Sep. 15, 2020 for Application No. 2017-5504137 with an English translation.

* cited by examiner

*Primary Examiner* — John S Chu
(74) *Attorney, Agent, or Firm* — Birch, Stewart, Kolasch & Birch, LLP.

(57) ABSTRACT

To provide a photocurable resin composition comprising an N-vinyl amide compound, a polyfunctional (meth)acrylate monomer and a photopolymerization initiator and having excellent adhesion to an optical substrate and free from an appearance defect such as a crack or shrinkage and a laminate having a coat layer obtained by curing the photocurable resin composition.

19 Claims, No Drawings

PHOTOCURABLE RESIN COMPOSITION

TECHNICAL FIELD

The present invention relates to a photocurable resin composition having excellent adhesion to a plastic substrate and a laminate having a cured body thereof (cured film).

BACKGROUND ART

Plastics have various characteristic properties such as lightweight, high workability and impact resistance and are used for various purposes such as spectacle lenses as materials substituting glass. Plastics have advantages such as lightweight, high impact resistance and high moldability as compared with glass whereas they have a disadvantage that their surfaces are easy damaged by contact, friction or scratching due to low surface abrasion resistance. Then, to improve abrasion resistance, there is proposed a method of forming a cured film for protecting the surface of a plastic. For instance, there is proposed a method of forming a cured film by applying a curable composition comprising a polyfunctional (meth)acrylate monomer having a (meth)acryloyl group to the surface of a plastic and photo-curing it (refer to JP-B 53-43553, JP-B 57-20968 and JP-A 2010-95569). Although these cured films have high surface hardness and excellent abrasion resistance, it was found that they may have an appearance defect such as a crack at the time of curing or low adhesion to a plastic substrate.

DISCLOSURE OF THE INVENTION

It is therefore an object of the present invention to provide a photocurable resin composition which provides a cured body (cured film) having high adhesion to a plastic substrate and no appearance defect such as a crack. It is another object of the present invention to provide a laminate having a cured body (cured film) of the above photocurable resin composition on a plastic substrate.

Other objects and advantages of the present invention will become apparent from the following description.

The inventors of the present invention conducted intensive studies to solve the above problems and found that the cause of the appearance defect and the reduction of the adhesion of a cured body of a curable resin composition comprising a polyfunctional (meth)acrylate monomer is that abrupt volume shrinkage occurs when the curable resin composition is cured. Then, when they studied the type of the polyfunctional (meth)acrylate monomer, a compound copolymerizable with the monomer and the mixing ratio of these to solve the above problems, they found that high adhesion is obtained and abrupt volume shrinkage at the time of curing can be suppressed by using a polyfunctional (meth)acrylate monomer and an N-vinyl amide compound. The present invention was accomplished based on this finding. That is, the present invention is a photocurable resin composition comprising:

(A) an N-vinyl amide compound represented by the following formula (1):

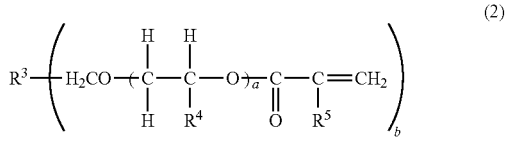

wherein $R^1$ and $R^2$ are each independently a hydrogen atom or hydrocarbon group having 1 to 5 carbon atoms, or $R^1$ and $R^2$ may be bonded together to form a hydrocarbon group having 2 to 6 carbon atoms;

(B) a polyfunctional (meth)acrylate monomer represented by the following formula (2):

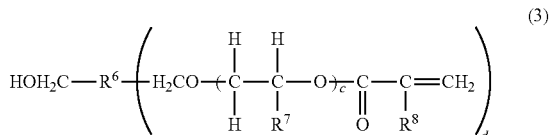

wherein $R^4$ and $R^5$ are each independently a hydrogen atom or methyl group, $R^3$ is a trivalent to hexavalent organic residue, "a" is an integer of 0 to 3, and "b" is an integer of 3 to 6; and (C) a photopolymerization initiator.

The above photocurable resin composition may advantageously take the following modes.

(1) The photocurable resin composition comprises 100 to 900 parts by mass of the polyfunctional (meth)acrylate monomer (B) based on 100 parts by mass of the N-vinyl amide compound (A).

(2) At least part of the polyfunctional (meth)acrylate monomer (B) comprises a hydroxyl group-containing polyfunctional (meth)acrylate monomer represented by the following formula (3).

$$HOH_2C-R^6 \left( H_2CO - \underset{\underset{H}{|}}{\overset{\overset{H}{|}}{C}} - \underset{\underset{R^7}{|}}{\overset{\overset{H}{|}}{C}} - O \right)_c \underset{\underset{O}{||}}{C} - \underset{\underset{R^8}{|}}{C} = CH_2 \right)_d \quad (3)$$

wherein $R^7$ and $R^8$ are each independently a hydrogen atom or methyl group, $R^6$ is a tetravalent to hexavalent organic residue, "c" is an integer of 0 to 3, and "d" is an integer of 3 to 5.

(3) The photocurable resin composition comprises 100 to 900 parts by mass of the polyfunctional (meth)acrylate monomer (B) based on 100 parts by mass of the N-vinyl amide compound (A) and 0.001 to 60 parts by mass of the above hydroxyl group-containing polyfunctional (meth)acrylate monomer based on 100 parts by mass of the polyfunctional (meth)acrylate monomer (B).

(4) The photocurable resin composition further comprises (D) a radical scavenger.

(5) The above radical scavenger (D) contains a compound having a 2,2,6,6-tetramethyl-4-piperidyl skeleton.

(6) The above compound having a 2,2,6,6-tetramethyl-4-piperidyl skeleton contains a compound represented by the following formula (4);

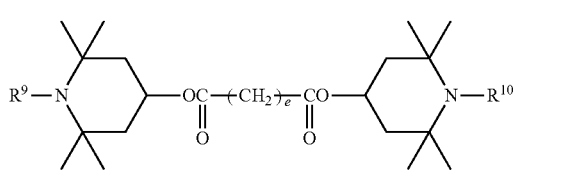

wherein $R^9$ and $R^{10}$ are each independently a hydrogen atom or methyl group, and "e" is an integer of 5 to 12.

The present invention further provides:

(7) a laminate comprising an optical substrate and a cured body (cured film) of the above photocurable resin composition on the surface of the optical substrate; and (8) a laminate comprising a primer layer, a coat layer containing a photochromic compound (may also simply referred to as "photochromic coat layer" hereinafter) and a hard coat layer in this order on the cured film of the laminate having the cured film of the photocurable resin composition.

PRACTICAL EMBODIMENT OF THE INVENTION

The photocurable resin composition of the present invention is characterized by comprising a combination of a specific N-vinyl amide compound and a specific functional (meth)acrylate monomer. A detailed description is subsequently given of each of the components constituting the photocurable resin composition of the present invention.

<(A) N-Vinyl Amide Compound>

The N-vinyl amide compound (A) (may also be referred to as "component (A)" hereinafter) used in the photocurable resin composition of the present invention is an N-vinyl amide compound represented by the following formula (1).

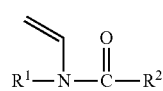

(1)

In the above formula, $R^1$ and $R^2$ are each independently a hydrogen atom or hydrocarbon group having 1 to 5 carbon atoms, or $R^1$ and $R^2$ may be bonded together to form a hydrocarbon group having 2 to 6 carbon atoms.

In $R^1$ and $R^2$, the hydrocarbon group having 1 to 5 carbon atoms is specified from the viewpoints of the curability of the photocurable resin composition, adhesion between a cured film obtained by curing, the photocurable resin composition and a plastic substrate, versatility and acquisition ease. It is particularly preferably a hydrocarbon group having 1 to 3 carbon atoms. Specific examples thereof include methyl group, ethyl group, propyl group, vinyl group, or the like.

When $R^1$ and $R^2$ are bonded together to form a hydrocarbon group having 2 to 6 carbon atoms, the N-vinyl amide compound forms β-lactam (2 carbon atoms), γ-lactam (3 carbon atoms), δ-lactam (4 carbon atoms), ε-lactam (5 carbon atoms) or ω-lactam (6 carbon atoms) according to the number of carbon atoms. These hydrocarbon groups can be advantageously used as the group of the N-vinyl amide compound used in the present invention. The number of carbon atoms of the above hydrocarbon group is the total number of carbon atoms of $R^1$ and $R^2$. The above hydrocarbon group may have a substituent such as alkyl group having 1 to 6 carbon atoms or aryl group having 6 to 14 carbon atoms. The number of carbon atoms of the above hydrocarbon group does not include the number of carbon atoms of the substituent and a number obtained by subtracting 1 from the number of carbon atoms all of which are ring members constituting the lactam ring (carbon atoms of a carbonyl).

Preferred examples of the N-vinyl amide compound represented by the above formula (1) include N-vinyl-β-lactam, N-vinyl pyrrolidone, N-vinyl-valerolactam, N-vinyl caprolactam, N-vinyl formamide, N-methyl-N-vinyl formamide, N-vinyl acetamide, N-methyl-N-vinyl acetamide, N-ethyl-N-vinyl acetamide, N-vinyl propionamide, N-methyl-N-vinyl propionamide, or the like. They may be used alone or in combination of two or more.

Out of these N-vinyl amide compounds, N-vinyl pyrrolidone, N-vinyl caprolactam and N-vinyl acetamide are particularly preferred from the viewpoints of the curability of the photocurable resin composition, adhesion between a cured film obtained by curing the photocurable resin composition and a plastic substrate, versatility and acquisition ease.

<(B) Polyfunctional (Meth)Acrylate Monomer>

The polyfunctional (meth)acrylate monomer (B) (may also be referred to as "component (B)" hereinafter) used in the photocurable resin composition of the present invention is a polyfunctional (meth)acrylate monomer represented by the following formula (2).

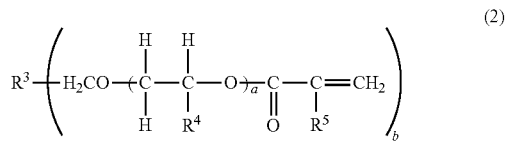

(2)

In the above formula, $R^4$ and $R^5$ are each independently a hydrogen atom or methyl group, $R^3$ is a trivalent to hexavalent organic residue, "a" is an integer of 0 to 3, and "b" is an integer of 3 to 6.

Examples of the trivalent to hexavalent organic residue represented by $R^3$ include groups represented by the following formulas.

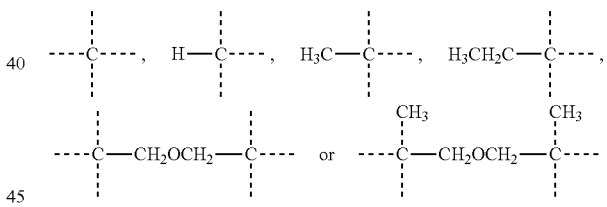

(In the above formulas, the number of broken lines is the number of bonds equivalent to the valence of $R^3$.) Out of the above examples, the first organic group in the second row is a trivalent organic group in which three broken lines extended from a carbon atom (C) bonded to an ethyl group ($H_3CH_2C-$) are the bonds of $R^3$. Similarly, the next organic group is a hexavalent organic group in which a total of 6 broken lines extended from two respective carbon atoms bonded to the right and left sides of central $-CH_2OCH_2-$ are the bonds of $R^3$. Out of these, the following groups are preferred from the viewpoints of the curability of the photocurable resin composition, adhesion between a cured film obtained by curing the photocurable resin composition and a plastic substrate, versatility and acquisition ease.

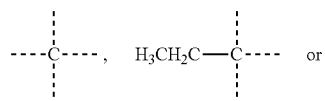

-continued

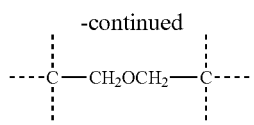

Regarding with a and b, "a" is preferably 0 or 1 and "b" is preferably 3 or 4 from the viewpoints of scratch resistance, adhesion between the cured film and the plastic substrate, appearance and viscosity easy for handling.

Preferred examples of the above polyfunctional acrylate monomer include trimethylolpropane tri(meth)acrylate, trimethylolmethane tri(meth)acrylate, trimethylolethane tri (meth)acrylate, ethoxylated pentaerythritol tetra(meth)acrylate, pentaerythritol tetra(meth)acrylate, dipentaerythritol hexa(meth)acrylate, trimethylolpropane triethylene glycol tri (meth)acrylate and ditrimethylolpropane tetraacrylate. They may be used alone or in combination of two or more. Out of these, pentaerythritol tetra(meth)acrylate, trimethylolpropane tri (meth)acrylate and dipentaerythritol hexa (meth)acrylate are particularly preferred from the viewpoints of the curability of the photocurable resin composition and adhesion between the cured film obtained by curing the photocurable resin composition and the plastic substrate.

The above component (B) preferably contains a hydroxyl group-containing polyfunctional (meth)acrylate monomer represented by the following formula (3).

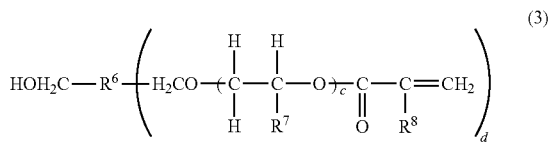

In the above formula, $R^7$ and $R^8$ are each independently a hydrogen atom or methyl group, $R^6$ is a tetravalent to hexavalent organic residue, "c" is an integer of 0 to 3, and "d" is an integer of 3 to 5.

By using the hydroxyl group-containing polyfunctional (meth)acrylate monomer represented by the above formula (3), compatibility between the component (A) and the component (B) can be further enhanced and an appearance defect can be further suppressed. When a primer layer is formed on the cured body (cured film) as will be described hereinafter, use of a primer composition having a substituent which reacts with a hydroxyl group such as an isocyanate group makes it possible to further improve adhesion between the cured film and the primer layer.

The tetravalent to hexavalent organic residue represented by $R^6$ is preferably a group represented by the following formula.

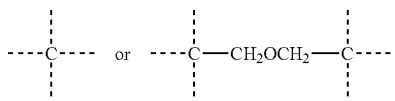

In the above formulas, the number of broken lines is the number of bonds equivalent to the valence of $R^6$.

Out of the above examples, the second organic group is a hexavalent organic group and should be understood that one of six bonds is bonded to $HOH_2C$—.

Regarding with c and d, "c" is preferably 0 or 1 and "d" is preferably 3 from the viewpoints of the scratch resistance of the cured film, adhesion between the cured film and the plastic substrate, appearance and viscosity easy for handling.

Preferred examples of the hydroxyl group-containing polyfunctional (meth)acrylate monomer represented by the above formula (3) include pentaerythritol tri (meth)acrylate and dipentaerythritol penta(meth)acrylate. Out of these, pentaerythritol tri (meth)acrylate is particularly preferred from the viewpoints of the curability of the photocurable resin composition and adhesion between the cured film obtained by curing the photocurable resin composition and the plastic substrate.

As the component (B) in the photocurable resin composition of the present invention, a mixture of the hydroxyl group-containing polyfunctional (meth)acrylate monomer represented by the above formula (3) and a polyfunctional (meth)acrylate monomer represented by the above formula (2) (may also be referred to as "the other polyfunctional (meth)acrylate monomer containing no hydroxyl group" hereinafter) excluding the hydroxyl group-containing polyfunctional (meth)acrylate monomer represented by the above formula (3) is particularly preferred as it can further enhance compatibility between the component (A) and the component (B) and suppress an appearance defect of the cured body (cured film).

When a mixture of the hydroxyl group-containing polyfunctional (meth)acrylate monomer represented by the above formula (3) and the other polyfunctional (meth) acrylate monomer containing no hydroxyl group is used as the component (B), the hydroxyl group-containing polyfunctional (meth)acrylate monomer represented by the above formula (3) is preferably used in the following amount from the viewpoints of adhesion between the plastic substrate and the cured body or cured film, the scratch resistance of the cured film and appearance. Stated more specifically, the amount of the hydroxyl group-containing polyfunctional acrylate monomer represented by the above formula (3) is preferably 0.001 to 60 parts by mass, more preferably 10 to 35 parts by mass based on 100 parts by mass of the polyfunctional (meth)acrylate monomer represented by the above formula (2) (that is, the total amount of the above mixture). In other words, when the amount of the mixture of the hydroxyl group-containing polyfunctional (meth)acrylate monomer represented by the above formula (3) and the other polyfunctional (meth)acrylate monomer containing no hydroxyl group (total amount of the polyfunctional (meth)acrylate monomers represented by the above formula (2)) is 100 parts by mass, preferably, the amount of the hydroxyl group-containing polyfunctional (meth)acrylate monomer represented by the above formula (3) is 0.001 to 60 parts by mass and the amount of the other polyfunctional (meth)acrylate monomer containing no hydroxyl group is 40 to 99.999 parts by mass. More preferably, the amount of the hydroxyl group-containing polyfunctional (meth)acrylate monomer represented by the above formula (3) is 10 to 35 parts by mass and the amount of the other polyfunctional (meth)acrylate monomer containing no hydroxyl group is 65 to 90 parts by mass.

<Preferred Blending Ratio of Component (A) and Component (B)>

The blending ratio of the component (A) and the component (B) in the photocurable resin composition of the present invention can be suitably determined in consideration of the type of the plastic substrate in use and the strength of the cured film obtained by curing the photocurable resin composition of the present invention. The amount of the component (B) is preferably 100 to 900 parts by mass, more preferably 200 to 600 parts by mass, most preferably 230 to 400 parts by mass based on 100 parts by mass of the component (A) from the viewpoints of adhesion between the plastic substrate and the cured film, the scratch resistance of the cured film and appearance.

<(C) Photopolymerization Initiator>

The photocurable resin composition of the present invention is cured by ultraviolet irradiation after the resin composition is applied to the plastic substrate. As the photopolymerization initiator (may also be referred to as "component (C)" hereinafter) used in the photocurable resin composition of the present invention may be used a known photopolymerization initiator used for photo-curing. Examples of the photopolymerization initiator include the following compounds.

Aromatic ketones such as 4,4'-bis(diethylamine)benzophenone, benzophenone, phenylglyoxylic acid methyl ester, 2-benzyl-2-dimethylamino-1-(4-morpholinophenyl)-butanone-1, and 2-methyl-1-[4-(methylthio)phenyl]-2-morpholino-propanone-1; quinones such as alkyl anthraquinones; benzoin compounds such as benzoin and alkyl benzoins; benzoin ether compounds such as benzoin alkyl ethers; benzyl compounds such as benzyl dimethyl ketal; phosphine oxide photopolymerization initiators such as benzoyl-diphenylphosphine oxide, 2,4,6-trimethylbenzoyl-diphenylphosphine oxide, 2,3,5,6-tetramethylbenzoyl-diphenylphosphine oxide, 3,4-dimethylbenzoyl-diphenylphosphine oxide, bis(2,4,6-trimethylbenzoyl) phenylphosphine oxide, bis(2,6-dimethoxybenzoyl) (2,4,4-trimethyl-pentyl) phosphine oxide and bis(2,6-dimethylbenzoyl)ethyl phosphine oxide; and polysilane photopolymerization initiators such as phenyl methyl polysilane, diphenyl polysilane and phenyl polysilane.

Out of the above photopolymerization initiators, acylphosphine oxide photopolymerization initiators and polysilane photopolymerization initiators are preferably used from the viewpoints of adhesion between the cured film and the plastic substrate and appearance. They may be used alone or in combination of two or more. The amount of the photopolymerization initiator differs according to polymerization conditions, the type of the initiator and the types and compositions of the polymerizable monomers and cannot be specified unconditionally but preferably 0.01 to 10 parts by mass based on 100 parts by mass of the total of the components (A) and the component (B) which are components to be polymerized.

<(D) Radical Scavenger>

The photocurable resin composition of the present invention may comprise a radical scavenger as a component (D). Any known radical scavenger may be used if it is generally mixed with a resin and has the ability of capturing a radical produced by the decomposition of a resin.

When the photocurable resin composition comprises the component (D), the storage stability of the composition is improved, whereby the photocurable resin composition exhibits excellent characteristic properties inherent therein after long-time storage. The radical scavenger is, for example, a hindered phenol radical scavenger or hindered amine radical scavenger.

Preferred examples of the hindered phenol radical scavenger include ethylenebis(oxyethylene)bis[3,5-tert-butyl-4-hydroxy-m-toluyl]propionate, octadecyl-3-(3,5-di-tert-butyl-4-hydroxyphenyl) propionate, pentaerythritol tetrakis [3-(3,5-di-tert-butyl-4-hydroxyphenyl)propionate, thiodiethylenebis[3-(3,5-di-tert-butyl-4-hydroxyphenyl] propionate, tris-(2-methyl-4-hydroxy-5-tert-butylphenyl)-butane, 4,4'-butylidenebis(3-methyl-6-tert-butylphenol), tris-(3,5-di-tert-butyl-4-hydroxyphenyl)isocyanurate, 2,4,6-tris[3,5-di-tert-butyl-4-hydroxybenzyl]-1,3,5-trimethylbenzene and 4-[[4,6-bis(octylthio)-1,3,5-triazin-2-yl]amino]2, 6-bis(1,1-dimethylethyl)phenol.

Preferred examples of the hindered amine radical scavenger include bis(2,2,6,6-tetramethyl-4-piperidyl)sebacate, bis(1,2,2,6,6-pentamethyl-4-piperidyl)sebacate, bis(l-octyloxy-2,2,6,6-tetramethyl-4-piperidyl)sebacate, 1-[2-{3-(3,5-di-t-butyl-4-hydroxyphenyl)propionyloxy}ethyl]-4-{3-(3,5-di-t-butyl-4-hydroxyphenyl) propionyloxy}-2,2,6,6-tetramethylpiperidine, 4-benzoyloxy-2,2,6,6-tetramethyl piperidine, methyl(1,2,2,6,6-pentamethyl-4-piperidyl)sebacate, 1,2,2,6,6-pentamethyl-4-piperidinyl methacrylate, 2-[[3,5-bis(1,1-dimethylethyl)-4-hydroxyphenyl]methyl]-2-butylpropane diacid[1,2,2,6,6-pentamethyl-4-piperidinyl] and poly[{6-(1,1,3,3-tetramethylbutyl)amino-1,3,5-triazin-2,4-diyl}{(2,2,6,6-tetramethyl-4-piperidyl}imino]hexamethylene{(2,2,6,6-tetramethyl-4-piperidyl)imino}].

These radical scavengers may be used alone or in combination of two or more.

Out of these radical scavengers, the component (D) preferably contains a compound having a 2,2,6,6-tetramethyl-4-piperidyl skeleton to retain high physical properties after long-time storage. Out of these, the component (D) preferably contains a compound represented by the following formula (4).

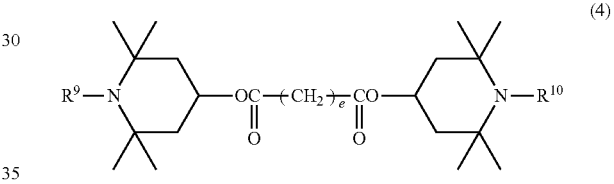

In the above formula, $R^9$ and $R^{10}$ are each independently a hydrogen atom or methyl group, and "e" is an integer of 5 to 12. Preferred examples of the compound represented by the above formula (4) include bis(2,2,6,6-tetramethyl-4-piperidyl)sebacate, bis(1,2,2,6,6-pentamethyl-4-piperidyl) sebacate, or the like.

An excellent effect is obtained by mixing a compound having a 2,2,6,6-tetramethyl-4-piperidyl skeleton, specifically the compound represented by the above formula (4) out of the above radical scavengers. Since it is considered that these radical scavengers have high compatibility with the component (A) and the component (B) used in the present invention, they can enhance effectively the long-time storage stability of the photocurable resin composition of the present invention which comprises the components (A) and (B).

In the present invention, the amount of the component (D) is not particularly limited but preferably 0.005 to 10 parts by mass, particularly preferably 0.01 to 1 part by mass based on 100 parts by mass of the total of the components (A) and (B) from the viewpoints of adhesion between the obtained cured film and the plastic substrate, the scratch resistance of the cured film, appearance and the storage stabilizing effect of the composition.

<Another Monomer Component; Bifunctional (Meth)Acrylate Monomer>

The photocurable resin composition of the present invention may comprise a bifunctional (meth)acrylate monomer for the control of the viscosity of the photocurable resin composition, the suppression of the production of a crack in the cured film obtained by curing the photocurable resin composition and adhesion between the cured film and the plastic substrate in addition to the component (B). Examples of the bifunctional (meth)acrylate monomer include ethylene glycol di(meth)acrylate, diethylene glycol di(meth)acrylate, triethylene glycol di(meth)acrylate, tetraethylene glycol di(meth)acrylate, pentaethylene glycol di(meth)acrylate, polyethylene glycol di(meth)acrylate having an average molecular weight of 536, 1,3-butanediol di(meth)acrylate, 1,4-butanediol di(meth)acrylate, 1,6-hexanediol di(meth)acrylate, 1,9-nonanediol di(meth)acrylate, 1,10-decanediol di(meth)acrylate, 2-methyl-1,8-octanediol di(meth)acrylate, tripropylene glycol di(meth)acrylate, tetrapropylene glycol di(meth)acrylate, pentapropylene glycol di(meth)acrylate, and polypropylene glycol di(meth)acrylate, having an average molecular weight of 536. The bifunctional (meth)acrylate monomers may be used alone or in combination of two or more.

When the bifunctional (meth)acrylate monomer is used in the present invention, the amount thereof is preferably not more than 10 parts by mass, particularly preferably 0.5 to 10 parts by mass based on 100 parts by mass of the component (B) from the viewpoints of the control of viscosity, the suppression of the production of a crack and adhesion between the cured film and the plastic substrate.

<Other Compounds>

The photocurable resin composition of the present invention may comprise various compounding agents as long as the effect of the present invention is not impaired. The compounding agents include additives such as surfactant, ultraviolet absorbent, coloring inhibitor, antistatic agent, fluorescent dye, dye, pigment, aroma chemical and plasticizer.

Known surfactants such as silicone-based surfactants having a silicone chain (polyalkylsiloxane unit) as a hydrophobic group and fluorine-based surfactants having a fluorinated carbon chain may be preferably used as the surfactant out of the above compounding agents. Preferred examples of the silicone-based surfactants and the fluorine-based surfactants include the L-7001, L-7002, L-7604 and FZ-2123 of Dow Corning Toray Co., Ltd., the MEGAFAC F-470, MEGAFAC F-1405 and MEGAFAC F-479 of DIC Corporation, and the FLORAD FC-430 of Sumitomo 3M Limited. These surfactants may be used alone or in combination of two or more. The amount of the surfactant is preferably 0.001 to 10 parts by mass based on 100 parts by mass of the total of the components (A) and (B).

<Method of Preparing Photocurable Resin Composition and Method of Forming Cured Body (Cured Film) of the Composition>

The photocurable resin composition of the present invention is prepared by weighing predetermined amounts of components and mixing them together. The order of adding the components is not particularly limited, and all the components may be added at the same time. Alternatively, only the components (A) and (B) are premixed together, and a photopolymerization initiator and other additives may be added to and mixed with the resulting premixture.

The laminate in the present invention is manufactured by applying the above photocurable resin composition to the plastic substrate and photo-curing it to form a layer on the plastic substrate. The plastic substrate to which the photocurable resin composition is applied is not particularly limited and may be a known plastic substrate for spectacle lenses, window glass for houses and automobiles, camera lenses and liquid crystal displays.

As the spectacle lenses, there are known plastic spectacle lenses such as (meth)acrylic resin, polycarbonate resin, allyl resin, thiourethane resin, urethane resin and thioepoxy resin spectacle lenses. When the curable resin composition of the present invention is used for spectacle lenses, it can be used for all these lenses. Out of these, polycarbonate resin and urethane resin spectacle lenses are preferred.

As the means of applying the photocurable resin composition of the present invention to the surface of the plastic substrate, known coating techniques such as spin coating, dip coating, bar coating and spray coating may be employed.

A laminate is formed by applying the photocurable resin composition of the present invention to the surface of the above-described optical substrate to form a coating film and photo-polymerizing and photo-curing it. In this case, prior to application, the pre-treatment of the optical substrate is preferably carried out to improve the coatability and adhesion to the optical substrate of the photocurable resin composition. Examples of this pre-treatment include chemical treatment with a basic aqueous solution or acidic aqueous solution, polishing with an abrasive, plasma treatment using atmospheric-pressure plasma and low-pressure plasma, corona discharge treatment and UV ozone treatment. They may be used in combination to improve the adhesion of the optical substrate.

As a treatment which can be easily used out of pre-treatments, a chemical treatment with a basic aqueous solution is preferred as the pre-treatment of the above-described spectacle lens substrate (optical substrate) and can further strengthen adhesion to the optical substrate. This treatment is carried out by impregnating the optical substrate with an alkali aqueous solution or carrying out ultrasonic washing while the optical substrate is impregnated with an alkali aqueous solution. As the alkali solution, a sodium hydroxide aqueous solution or potassium hydroxide aqueous solution is used. The concentration of the hydroxide is preferably 5 to 30 mass %. The treatment temperature is suitably determined in consideration of the heat resistance of the substrate in use but preferably 20 to 60° C. The treatment time which differs according to treatment conditions is preferably 1 minute to 1 hour, more preferably 5 to 15 minutes. Besides the alkali aqueous solution, for example, a mixed solution of water and an alcohol solvent and an alcohol solution may be used. An aqueous solution prepared by adding a lower alcohol such as methanol, ethanol or isopropyl alcohol as the alcohol in use and an organic base such as 1-methyl-2-pyrrolidone as a trace additive in an amount of 1 to 10 parts by mass based on 100 parts by mass of the alkali solution may be used. After the alkali treatment, the optical substrate should be rinsed with water such as pure water, ion exchange water or distilled water and then dried.

The laminate can be formed by applying the photocurable resin composition to the optical substrate which has been pre-treated and photo-curing it. The thickness of a layer composed of the cured body of the photocurable resin composition in the laminate obtained by the above method is preferably 1 to 20 μm, more preferably 3 to 10 μm. The cured body can be obtained, for example, by applying the photocurable resin composition to a thickness of 1 to 20 μm and irradiating it with ultraviolet light to form a cured film.

To cure the photocurable resin composition of the present invention, ultraviolet light from a light source such as xenon lamp, high-pressure mercury lamp or metal halide lamp may be used. Although suitable irradiation conditions can be set as required, the integrated amount of light is preferably not less than 0.4 J/cm$^2$, more preferably not less than 1.7 J/cm$^2$ and not more than 10 J/cm$^2$.

<Laminate Having a Primer Layer, a Coat Layer Containing a Photochromic Compound (Photochromic Coat Layer) and a Hard Coat Layer in this Order on a Laminate Having the Cured Body (Cured Film) of Photocurable Resin Composition>

The plastic substrate on which the cured body (cured film) of the photocurable resin composition of the present invention has thus been formed has high surface hardness and excellent abrasion resistance and can be directly used for a desired purpose. Layers such as a primer layer and a hard coat layer can be further formed on the above cured body (cured film). As described above, the laminate having the cured body (cured film) of the photocurable resin composition of the present invention has the high surface hardness of the cured body (cured film) and excellent abrasion resistance. Even when a primer layer and a hard coat layer are formed on the cured body (cured film), high surface hardness and abrasion resistance are retained. Therefore, the laminate of the present invention can be advantageously used for purposes in which these layers are formed. When a coat layer containing a photochromic compound (photochromic coat layer) is further formed, photochromic properties can be provided to the obtained laminate. Further, a photochromic lens having high surface hardness and abrasion resistance can be obtained.

As the primer coat layer to be formed on the laminate having the cured body (cured film) of the photocurable resin composition of the present invention, known primer coat layers may be used. Out of these, a primer coat layer made of a moisture-curable polyurethane resin having an isocyanate group/precursor thereof reacts with the hydroxyl group of the component (B) to provide strong adhesion. The primer coat layer can be formed by applying a primer coat agent for forming the layer to the above laminate and drying it. The thickness of the primer coat layer is suitably determined according to an apparatus and method for the production of the primer coat layer. The thickness of the primer coat layer is preferably 1 to 10 µm from the viewpoint of adhesion (bonding property) between the primer coat layer and a photochromic layer formed on the primer coat layer.

The means of applying the primer coat agent is not particularly limited and may be dipping, spin coating or dip spin coating. Out of these, spin coating is preferably employed as a coating film having a good appearance is easily obtained. When the coating solution is applied by spin coating, the following procedure is recommended. The coating solution contained in a vessel is first let flow out from a nozzle and dropped on the surface of the optical substrate. Thereafter, the dropped coating solution is spread to the entire surface of the substrate with centrifugal force by turning the optical substrate at a high speed, and a surplus coating solution is scattered and removed. To obtain a good appearance, the nozzle should be moved linearly toward the outside in the radial direction from the center of the optical substrate while the optical substrate is turned at a low speed. Preferably, the coating solution is dropped spirally and then the substrate is turned at a high speed after dropping. Prior to the application of the primer coat agent to the laminate, the above-described pre-treatment is preferably carried out to improve adhesion.

Subsequently, after a photochromic coating agent containing a photochromic compound is applied to the primer coat layer, it is cured to laminate a photochromic coat layer. A known photochromic coating agent may be used. Any photochromic compound which exhibits a photochromic function may be used. Photochromic compounds such as fulgide compounds, chromene compounds and spirooxazine compounds are well known and may be used in the present invention. They may be used alone or in combination of two or more. Examples of the above fulgide compounds, chromene compounds and spirooxazine compounds include compounds described in JP-A 2-28154, JP-A 62-288830 WO94/22850 and WO96/14596.

When the photochromic coating agent is to be applied to the optical substrate having the primer coat layer, it is not necessary to carry out the pre-treatment, and the photochromic coating agent (composition) should be applied after the primer coat layer is cured (dried) and cooled. As the means of applying the photochromic coating agent to the optical substrate having the primer coat layer, dip coating, spin coating or dip spin coating may be used. Out of these, spin coating is preferably employed from the viewpoint of the uniformity of the coating film.

The thickness of the photochromic coating agent layer applied by this coating technique is preferably relatively large to obtain satisfactory color optical density even when the concentration of the photochromic compound in the photochromic coating agent is low and the high durability of photochromic properties. More specifically, the thickness of the photochromic coat layer after curing is preferably 10 to 100 µm, particularly preferably 20 to 50 µm. To set the thickness of the photochromic coat layer to this value, the viscosity at 25° C. of the photochromic coating agent is set to preferably 20 to 1,000 cP, more preferably 50 to 800 cP, much more preferably 70 to 500 cP.

As the method of curing the photochromic coating agent layer, a photo-curing method or thermal curing method is suitably employed according to the type of the radical polymerization initiator in use. From the viewpoints of the physical properties and appearance of the obtained photochromic coat layer, a method in which polymerization is completed by heating after the photochromic coating agent is cured by irradiation using a photopolymerization initiator is preferably employed. At this point, a thermopolymerization initiator may be used in combination. As a light source used for photo-curing, a light source having emission wavelength capable of curing with a photopolymerization initiator should be used, as exemplified by lamps having an electrode such as metal halide lamp, super high-pressure mercury lamp, high-pressure mercury lamp, moderate-pressure mercury lamp, germicidal lamp, xenon lamp, carbon arc and tungsten lamp, and electrodeless lamps. An electron beam may be used as a light source. In this case, a photochromic coating agent layer can be cured without adding a photopolymerization initiator. Examples of the thermal curing method include a method in which thermopolymerization is carried out by heating in a polymerization furnace and a method in which polymerization and curing are carried out by applying infrared light in a polymerization furnace.

A known coating agent (hard coat agent) for forming a hard coat layer may be used. Examples of the hard coat agent include silane coupling agents, hard coat agents containing oxide sol of silicon, zirconium, antimony, aluminum or titanium as the main component and hard coat agents containing an organic polymer as the main component. To apply the hard coat agent, dip coating, spin coating and dip spin coating may be used. This applied hard coat agent is cured by a known method, for example, heating to form a hard coat layer.

EXAMPLES

The following examples are provided for the purpose of further illustrating the present invention but are in no way to be taken as limiting. Components used in the following examples are given below.

Component (A) (N-vinyl amide compound)
A-1: N-vinyl pyrrolidone
A-2: N-vinyl acetamide
Component (B) (polyfunctional (meth)acrylate monomer containing no hydroxyl group which is polyfunctional (meth)acrylate monomer represented by formula (2))
B-1: pentaerythritol tetraacrylate
B-2: trimethylolpropane triacrylate (hydroxy group-containing polyfunctional (meth)acrylate monomer represented by formula (3))
B-3: pentaerythritol triacrylate
B-4: dipentaerythritol pentaacrylate Component (C) (photopolymerization initiator)
C-1: bis(2,4,6-trimethylbenzoyl)-phenylphosphine oxide
C-2: 2,4,6-trimethylbenzoyl-diphenylphosphine oxide Component (D); radical scavenger
D-1: bis(1,2,2,6,6-pentamethyl-piperidyl)sebacate
D-2: ethylenebis(oxyethylene)bis[3,5-tert-butyl-4-hydroxy-m-toluyl]propionate
D-3: tris-(2-methyl-4-hydroxy-5-tert-butylphenyl)-butane
D-4: bis(1-octyloxy-2,2,6,6-tetramethyl-4-piperidyl)sebacate
(E) another monomer component
E-1: ethylene glycol diacrylate
Photochromic compound
PC1:

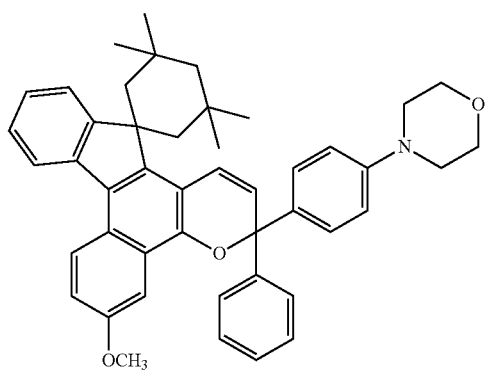

PC2:

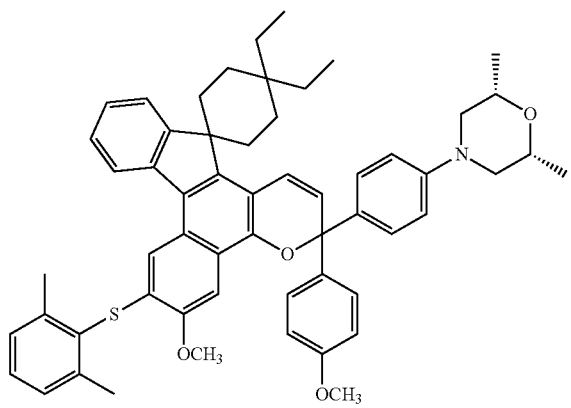

PC3:

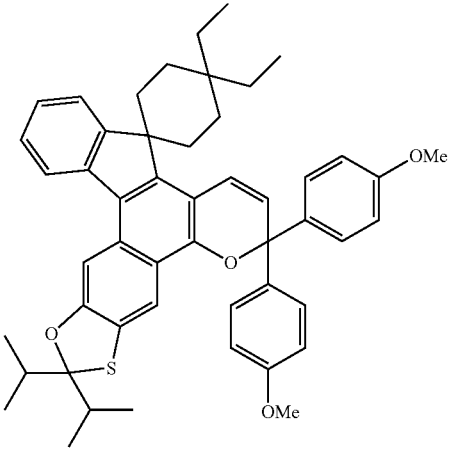

Example 1

(Preparation of Photocurable Resin Composition)

7.5 parts by mass of C-1 and 1 part by mass of a surfactant (L-7001 of Dow Corning Toray Co., Ltd.) were added to and dissolved in a mixture of 100 parts by mass of A-1, 313 parts by mass of B-1 and 87 pars by mass of B-3 under agitation. After dissolution was confirmed, the resulting solution was filtered with a 0.45 μm membrane filter and deaerated under a reduced pressure of 0.09 Mpa for 10 minutes. The amounts of these components are shown in Table 1 but the amount of the above surfactant is not shown in Table 1.

(Production of Laminate)

A polycarbonate resin plastic lens (refractive index of 1.59) was used as the plastic substrate. This plastic optical substrate was subjected to a supersonic treatment with a 50° C. 5% sodium hydroxide aqueous solution for 5 minutes, rinsed with running water for 5 minutes and then with distilled water for 5 minutes and dried at 150° C. After drying, a spin coater was used to apply the photocurable resin composition to a thickness of 5.5 to 7.2 μm. This coating film was irradiated with ultraviolet light by using F3000SQ (of Heraeus Co., Ltd.) having an output of 120 mW/cm² and equipped with a D valve to be cured so as to obtain a laminate having the cured body (cured body layer thickness of 5.0 to 6.5 μm) (cured film)) of the photocurable resin composition. The following evaluations were made on the obtained laminate. The evaluation results are shown in Table 1.

<Evaluation Methods of Laminate>

1. Appearance

The laminate was irradiated with light from a high-pressure mercury lamp to project a projection plane on white paper which was observed visually. The evaluation criteria are given below.

○: no problem with appearance
Δ: a small appearance defect such as shrinkage can be seen
X: an appearance defect such as a crack or shrinkage can be seen 2. Adhesion Adhesion was evaluated by a cross-cut tape test. That is, a cutter knife was used to make cuts in the surface of the laminate having the cured body (cured film) of the photocurable resin composition at intervals of about 1 mm so as to form 100 squares. A cellophane adhesive tape (Cellotape (registered trademark) of Nichiban Co., Ltd.) was strongly attached to the surface and then peeled off from the surface at a stretch in a 90° direction to count the number of squares (out of the 100 squares) left behind of the coating film. The adhesion was evaluated based on the following three criteria.
A: 100/100
B: 99/100 to 95/100
C: less than 95/100

3. Adhesion after Immersion in Boiling Water

After the laminate was immersed in boiling water for 1 hour, the plastic lens was taken out and water drops were wiped off from the plastic lens to evaluate adhesion in the same manner as the above adhesion evaluation method.

A: rarely scratched (less than 5 scratches are seen)
B: slightly scratched (5 or more to less than 10 scratches are seen)
C: scratched (10 or more to less than 20 scratches are seen)
D: markedly scratched (20 or more scratches are seen)
E: peeled off Examples 2 to 15, Comparative Examples 1 to 2

Laminates having a cured body (cured film) of each of the photocurable resin compositions shown in Table 1 was manufactured and evaluated in the same manner as in Example 1. The evaluation results are shown in Table 1. In the examples and comparative examples, the same amount of the same surfactant as in Example 1 was used and therefore not shown in Table 1.

TABLE 1

| | Photocurable resin composition (parts by mass) | | | | evaluation results of laminate | | | | | |
| | | | | | | | adhesion after immersion in boiling water | | | scratch |
| | Component (A) | Component (B) | Component (C) | another component | appearance | adhesion | (1H) | (2H) | (3H) | resistance |
|---|---|---|---|---|---|---|---|---|---|---|
| Ex. 1 | A-1 (100) | B-1/B-3 (313/87) | C-1 (7.5) | — | ○ | A | A | A | A | A |
| Ex. 2 | A-1 (100) | B-1/B-2/B-3 (197/159/45) | C-1 (7.5) | — | ○ | A | A | A | A | A |
| Ex. 3 | A-1 (100) | B-2/B-3 (168/232) | C-1 (7.5) | — | ○ | A | A | A | A | A |
| Ex. 4 | A-1 (100) | B-1/B-4 (342/58) | C-1 (7.5) | — | ○ | A | A | A | A | A |
| Ex. 5 | A-1 (100) | B-1/B-3 (98/135) | C-1 (5) | — | ○ | A | A | A | A | A |
| Ex. 6 | A-1 (100) | B-1/B-3 (520/280) | C-1 (13.5) | — | ○ | A | A | A | B | A |
| Ex. 7 | A-1 (100) | B-1/B-3 (65/36) | C-1 (3) | — | Δ | A | A | A | A | B |
| Ex. 8 | A-1 (100) | B-4 (400) | C-1 (7.5) | — | ○ | A | A | B | C | A |
| Ex. 9 | A-1 (100) | B-1/B-3 (313/87) | C-1 (7.5) | E-1 (25) | ○ | A | A | A | A | A |
| Ex. 10 | A-1 (100) | B-1 (313) | C-1 (6.2) | — | Δ | A | A | A | A | A |
| Ex. 11 | A-1 (100) | B-1/B-3 (40/360) | C-1 (7.5) | — | ○ | A | B | B | C | A |
| Ex. 12 | A-1 (100) | B-1/B-3 (28/39) | C-1 (2.5) | — | Δ | A | B | A | A | C |
| Ex. 13 | A-1 (100) | B-1/B-3 (580/420) | C-1 (16.5) | — | Δ | A | B | B | C | A |
| Ex. 14 | A-2 (100) | B-1/B-3 (313/87) | C-1 (7.5) | — | ○ | A | A | A | A | A |
| Ex. 15 | A-2 (100) | B-1/B-4 (342/58) | C-1 (7.5) | — | ○ | A | A | A | A | A |
| C. Ex. 1 | — | B-1 (400) | C-1 (6) | — | Δ | B | B | C | C | A |
| C. Ex. 2 | A-1 (100) | — | C-1 (1.5) | — | × | C | C | C | C | E |

Ex.: Example
C. Ex.: Comparative Example

After evaluation, this laminate was immersed in boiling water again. This operation was repeated three times to carry out the test until the total boiling time became 3 hours.

4. Steel Wool Scratch Resistance

The surface of the plastic lens of the laminate having the cured body (cured film) of the photocurable resin composition was rubbed with steel wool (BONSTAR #0000 of Nippon Steel Wool Co., Ltd.) 10 times in both ways to evaluate the degree of scratching visually based on the following four criteria. The evaluation criteria are given below.

Example 16

(Preparation of Photochromic Coating Agent)

A photochromic coating agent was obtained by mixing together the following components under agitation at 70° C. for 15 minutes based on the following formulation. trimethylolpropane trimethacrylate: 20 parts by mass ditrimethylolpropane tetramethacrylate: 30 parts by mass 2,2-bis[4-(methacryloxy-polyethoxy)phenyl]propane (average chain length of ethylene glycol chains of 10, average molecular weight of 804): 30 parts by mass polyethylene glycol dimethacrylate (average chain length of ethylene glycol chains of 14, average molecular weight of 736): 20 parts by mass
PC1: 0.3 part by mass
PC2: 1.0 part by mass
PC3: 2.0 parts by mass
bis(1,2,2,6,6-pentamethyl-4-piperidyl)sebacate: 3 parts by mass
ethylenebis(oxyethylene)bis[3-(5-tert-butyl-4-hydroxy-m-tolyl)propionate]: 3 parts by mass
phenylbis(2,4,6-trimethylbenzoyl)-phosphine oxide (polymerization initiator): 0.3 part by mass
L-7001 (of Dow Corning Toray Co., Ltd.): 0.1 part by mass
(Preparation of Hard Coat Agent)

20.8 parts by mass of γ-glycidoxypropyl trimethoxysilane and 8.2 part by mass of tetraethoxysilane as organic silicon compounds and 4.9 parts by mass of t-butyl alcohol and 0.1 part by mass of L-7001 (of Dow Corning Toray Co., Ltd.) as organic solvents were mixed together. A mixture of 9.0 parts by mass of water and 18.0 parts by mass of SNOWTEX 0-40 (of Nissan Chemical Industries, Ltd.) was added to the resulting solution under agitation and kept stirred for 20 hours after the end of addition. Then, 3.4 parts by mass of ethylene glycol monoisopropyl ether, 4.5 parts by mass of acetyl acetone, 15.1 parts by mass of t-butyl alcohol, 15.16 parts by mass of methanol and 0.84 part by mass of tris(acetylacetonato)aluminum (III) were mixed with the resulting solution and stirred for 2 hours to prepare a hard coat agent.

(Manufacture of Laminate Having a Primer Layer, a Coat Layer Containing a Photochromic Compound (Photochromic Coat Layer) and a Hard Coat Layer in this Order on the Cured Body (Cured Film) of Photocurable Resin Composition)

A laminate having the cured body (cured film) of the photocurable resin composition prepared in the same manner as in Example 1 was immersed in a 40° C. 20% potassium hydroxide aqueous solution for 30 seconds, rinsed with running water for 5 minutes and then with distilled water for 5 minutes and dried at 150° C. Then, TR-SC-P (manufactured by Tokuyama Corporation; containing a moisture-curable urethane resin as the main component) was used as a primer coating solution to be applied to the surface of the laminate having the cured body (cured film) of the photocurable resin composition by spin coating. After the application of the primer coating solution, it was left at room temperature for 5 minutes to form a primer layer having a thickness of 7 μm.

Thereafter, about 1 g of the above photochromic coating agent was spin coated on the surface of the above primer layer to a thickness of 40±1 μm. The coated laminate was irradiated with light by adjusting integrated illuminance on the surface of the laminate to 10 J/cm$^2$ within 40 seconds with the F3000SQ in a nitrogen gas atmosphere to cure the coating film. Thereafter, the photochromic coat layer was formed by heating in a 90° C. incubator for 1 hour.

The laminate having the photochromic coat layer was subjected to a corona discharge treatment for 30 seconds, immersed in a 50° C. 10% sodium hydroxide aqueous solution and then subjected to alkali etching for 5 minutes by using an ultrasonic cleaner. After alkali etching, the laminate was rinsed with tap water and distilled water sequentially to remove the residual alkali and dried at 150° C. A hard coat agent was dip coated on this laminate to a thickness of 2.5 μm. After dip coating, the hard coat agent was precured in a 70° C. oven for 15 minutes and thermally cured at 130° C. for 3 hours to obtain a laminate having a hard coat layer. The appearance of the obtained laminate, and the adhesion and adhesion after immersion in boiling water of the layers formed on the plastic substrate were evaluated by the same methods as described above. The results are shown in Table 2.

Examples 17 to 30, Comparative Examples 3 to 5

Laminates were formed on the laminate having the cured body (cured film) of each of the photocurable resin compositions shown in Table 2 in the same manner as in Example 16 and evaluated in the same manner as in Example 1. The evaluation results are shown in Table 2. Since the same amount of the same surfactant as in Example 1 was used in the photocurable resin compositions of the examples and comparative examples, the amount of the surfactant was not shown in Table 2.

TABLE 2

| | Photocurable resin composition (parts by mass) | | | | evaluation results of laminate | | | | |
|---|---|---|---|---|---|---|---|---|---|
| | | | | | | | adhesion after immersion in boiling water | | |
| | Component (A) | Component (B) | Component (C) | another component | appearance | adhesion | (1H) | (2H) | (3H) |
| Ex. 16 | A-1 (100) | B-1/B-3 (313/87) | C-1 (7.5) | — | ○ | A | A | A | A |
| Ex. 17 | A-1 (100) | B-1/B-2/B-3 (197/159/45) | C-1 (7.5) | — | ○ | A | A | A | A |
| Ex. 18 | A-1 (100) | B-2/B-3 (168/232) | C-1 (7.5) | — | ○ | A | A | A | A |
| Ex. 19 | A-1 (100) | B-1/B-4 (342/58) | C-1 (7.5) | — | ○ | A | A | A | A |
| Ex. 20 | A-1 (100) | B-1/B-3 (98/135) | C-1 (5) | — | ○ | A | A | A | A |
| Ex. 21 | A-1 (100) | B-1/B-3 (520/280) | C-1 (13.5) | — | ○ | A | A | A | B | B |
| Ex. 22 | A-1 (100) | B-1/B-3 (65/36) | C-1 (3) | — | Δ | A | A | A | A |
| Ex. 23 | A-1 (100) | B-4 (400) | C-1 (7.5) | — | ○ | A | B | B | C |
| Ex. 24 | A-1 (100) | B-1/B-3 (313/87) | C-1 (7.5) | E-1 (25) | ○ | A | A | A | A |

TABLE 2-continued

|  | Photocurable resin composition (parts by mass) | | | | evaluation results of laminate | | | | |
|---|---|---|---|---|---|---|---|---|---|
|  | Component (A) | Component (B) | Component (C) | another component | appearance | adhesion | adhesion after immersion in boiling water | | |
|  |  |  |  |  |  |  | (1H) | (2H) | (3H) |
| Ex. 25 | A-1 (100) | B-1 (313) | C-1 (6.2) | — | Δ | A | A | B | C |
| Ex. 26 | A-1 (100) | B-1/B-3 (40/360) | C-1 (7.5) | — | ○ | A | B | C | C |
| Ex. 27 | A-1 (100) | B-1/B-3 (28/39) | C-1 (2.5) | — | Δ | A | A | A | B |
| Ex. 28 | A-1 (100) | B-1/B-3 (580/420) | C-1 (16.5) | — | Δ | A | B | C | C |
| Ex. 29 | A-2 (100) | B-1/B-3 (313/87) | C-1 (7.5) | — | ○ | A | A | A | A |
| Ex. 30 | A-2 (100) | B-1/B-4 (342/58) | C-1 (7.5) | — | ○ | A | A | A | A |
| C. Ex. 3 | — | B-1 (400) | C-1 (6) | — | Δ | B | C | C | C |
| C. Ex. 4 | A-1 (100) | — | C-1 (1.5) | — | x | C | C | C | C |
| C. Ex. 5 | — | B-1/B-2 (400/100) | C-1 (7.5) | — | Δ | A | C | C | C |

Ex.: Example
C. Ex.: Comparative Example

Examples 31 to 36

Photocurable resin compositions shown in Table 3 were prepared. Laminates were manufactured by using the obtained photocurable resin compositions in the same manner as in Example 16, and the physical properties of the laminates right after molding were evaluated in the same manner as in Example 16. The evaluation results are shown in Table 3.

Then, the photocurable resin compositions having the same composition as in Example 16 and Example 19 and the photocurable resin compositions (Examples 31 to 36) shown in Table 3 were kept in an incubator kept at 40° C. for 2 weeks and 1 month. After the elapse of the storage periods, laminates were manufactured by using the photocurable resin compositions taken out from the incubator and evaluated in the same manner as in Example 16. The evaluation results of the photocurable resin compositions after 2 weeks of storage are shown in Table 4. The evaluation results of the photocurable resin compositions after 1 month of storage are shown in Table 5.

Since the same amount of the same surfactant as in Example 1 was used in the photocurable resin compositions of the examples, the amount of the surfactant was not shown in Tables 3, 4 and 5.

TABLE 3

|  | Photocurable resin composition (parts by mass) | | | | evaluation results of laminate (initial) | | | | |
|---|---|---|---|---|---|---|---|---|---|
|  | Component (A) | Component (B) | Component (C) | another component | appearance | adhesion | adhesion after immersion in boiling water | | |
|  |  |  |  |  |  |  | (1H) | (2H) | (3H) |
| Ex. 31 | A-1 (100) | B-1/B-3 (313/87) | C-1 (7.5) | D-1 (0.1) | ○ | A | A | A | A |
| Ex. 32 | A-1 (100) | B-1/B-3 (313/87) | C-1 (7.5) | D-2 (0.4) | ○ | A | A | A | A |
| Ex. 33 | A-1 (100) | B-1/B-3 (313/87) | C-1 (7.5) | D-3 (0.5) | ○ | A | A | A | A |
| Ex. 34 | A-1 (100) | B-1/B-3 (313/87) | C-1 (7.5) | D-4 (0.5) | ○ | A | A | A | A |
| Ex. 35 | A-1 (100) | B-1/B-4 (342/58) | C-1 (7.5) | D-1 (1.0) | ○ | A | A | A | A |
| Ex. 36 | A-1 (100) | B-1/B-3 (313/87) | C-2 (7.5) | D-1 (0.1) | ○ | A | A | A | A |
| Ex. 16 | A-1 (100) | B-1/B-3 (313/87) | C-1 (7.5) | — | ○ | A | A | A | A |
| Ex. 19 | A-1 (100) | B-1/B-4 (342/58) | C-1 (7.5) | — | ○ | A | A | A | A |

Ex.: Example

TABLE 4

| | Photocurable resin composition (parts by mass) | | | | evaluation results of laminate (2 weeks) | | | | |
| | | | | | | | adhesion after immersion in boiling water | | |
| | Component (A) | Component (B) | Component (C) | another component | appearance | adhesion | (1H) | (2H) | (3H) |
|---|---|---|---|---|---|---|---|---|---|
| Ex. 31 | A-1 (100) | B-1/B-3 (313/87) | C-1 (7.5) | D-1 (0.1) | ○ | A | A | A | A |
| Ex. 32 | A-1 (100) | B-1/B-3 (313/87) | C-1 (7.5) | D-2 (0.4) | ○ | A | A | A | A |
| Ex. 33 | A-1 (100) | B-1/B-3 (313/87) | C-1 (7.5) | D-3 (0.5) | ○ | A | A | A | A |
| Ex. 34 | A-1 (100) | B-1/B-3 (313/87) | C-1 (7.5) | D-4 (0.5) | ○ | A | A | A | A |
| Ex. 35 | A-1 (100) | B-1/B-4 (342/58) | C-1 (7.5) | D-1 (1.0) | ○ | A | A | A | A |
| Ex. 36 | A-1 (100) | B-1/B-3 (313/87) | C-2 (7.5) | D-1 (0.1) | ○ | A | A | A | A |
| Ex. 16 | A-1 (100) | B-1/B-3 (313/87) | C-1 (7.5) | — | ○ | A | A | A | A |
| Ex. 19 | A-1 (100) | B-1/B-4 (342/58) | C-1 (7.5) | — | ○ | A | A | A | A |

Ex.: Example

TABLE 5

| | Photocurable resin composition (parts by mass) | | | | evaluation results of laminate (1 month) | | | | |
| | | | | | | | adhesion after immersion in boiling water | | |
| | Component (A) | Component (B) | Component (C) | another component | appearance | adhesion | (1H) | (2H) | (3H) |
|---|---|---|---|---|---|---|---|---|---|
| Ex. 31 | A-1 (100) | B-1/B-3 (313/87) | C-1 (7.5) | D-1 (0.1) | ○ | A | A | A | A |
| Ex. 32 | A-1 (100) | B-1/B-3 (313/87) | C-1 (7.5) | D-2 (0.4) | ○ | A | A | A | A |
| Ex. 33 | A-1 (100) | B-1/B-3 (313/87) | C-1 (7.5) | D-3 (0.5) | ○ | A | A | A | A |
| Ex. 34 | A-1 (100) | B-1/B-3 (313/87) | C-1 (7.5) | D-4 (0.5) | ○ | A | A | A | A |
| Ex. 35 | A-1 (100) | B-1/B-4 (342/58) | C-1 (7.5) | D-1 (1.0) | ○ | A | A | A | A |
| Ex. 36 | A-1 (100) | B-1/B-3 (313/87) | C-2 (7.5) | D-1 (0.1) | ○ | A | A | A | A |
| Ex. 16 | A-1 (100) | B-1/B-3 (313/87) | C-1 (7.5) | — | ○ | A | C | C | C |
| Ex. 19 | A-1 (100) | B-1/B-4 (342/58) | C-1 (7.5) | — | ○ | A | C | C | C |

Ex.: Example

Examples 37 to 42

Photocurable resin composition having the same compositions as in Examples 31 to 36 were used to manufacture laminates in the same manner as in Examples 31 to 36 except that a polyurethane resin plastic lens (trade name: TRIVEX, refractive index of 1.53) was used as the plastic substrate, and the same evaluations were made on the laminates.

The same photocurable resin composition as in Example 31 was used in Example 37, the same photocurable resin composition as in Example 32 was used in Example 38, the same photocurable resin composition as in Example 33 was used in Example 39, the same photocurable resin composition as in Example 34 was used in Example 40, the same photocurable resin composition as in Example 35 was used in Example 41, and the same photocurable resin composition as in Example 36 was used in Example 42. Since the same amount of the same surfactant as in Example 1 was used in the photocurable resin compositions of these examples, the amount of the surfactant was not shown in Tables 6, 7 and 8.

The results are shown in Tables 6, 7 and 8.

TABLE 6

| | Photocurable resin composition (parts by mass) | | | | evaluation results of laminate (initial) | | | | |
|---|---|---|---|---|---|---|---|---|---|
| | Component (A) | Component (B) | Component (C) | another component | appearance | adhesion | adhesion after immersion in boiling water | | |
| | | | | | | | (1H) | (2H) | (3H) |
| Ex. 37 | A-1 (100) | B-1/B-3 (313/87) | C-1 (7.5) | D-1 (0.1) | ○ | A | A | A | A |
| Ex. 38 | A-1 (100) | B-1/B-3 (313/87) | C-1 (7.5) | D-2 (0.4) | ○ | A | A | A | A |
| Ex. 39 | A-1 (100) | B-1/B-3 (313/87) | C-1 (7.5) | D-3 (0.5) | ○ | A | A | A | A |
| Ex. 40 | A-1 (100) | B-1/B-3 (313/87) | C-1 (7.5) | D-4 (0.5) | ○ | A | A | A | A |
| Ex. 41 | A-1 (100) | B-1/B-4 (342/58) | C-1 (7.5) | D-1 (1.0) | ○ | A | A | A | A |
| Ex. 42 | A-1 (100) | B-1/B-3 (313/87) | C-2 (7.5) | D-1 (0.1) | ○ | A | A | A | A |

Ex.: Example

TABLE 7

| | Photocurable resin composition (parts by mass) | | | | evaluation results of laminate (2 weeks) | | | | |
|---|---|---|---|---|---|---|---|---|---|
| | Component (A) | Component (B) | Component (C) | another component | appearance | adhesion | adhesion after immersion in boiling water | | |
| | | | | | | | (1H) | (2H) | (3H) |
| Ex. 37 | A-1 (100) | B-1/B-3 (313/87) | C-1 (7.5) | D-1 (0.1) | ○ | A | A | A | A |
| Ex. 38 | A-1 (100) | B-1/B-3 (313/87) | C-1 (7.5) | D-2 (0.4) | ○ | A | A | A | A |
| Ex. 39 | A-1 (100) | B-1/B-3 (313/87) | C-1 (7.5) | D-3 (0.5) | ○ | A | A | A | A |
| Ex. 40 | A-1 (100) | B-1/B-3 (313/87) | C-1 (7.5) | D-4 (0.5) | ○ | A | A | A | A |
| Ex. 41 | A-1 (100) | B-1/B-4 (342/58) | C-1 (7.5) | D-1 (1.0) | ○ | A | A | A | A |
| Ex. 42 | A-1 (100) | B-1/B-3 (313/87) | C-2 (7.5) | D-1 (0.1) | ○ | A | A | A | A |

Ex.: Example

TABLE 8

| | Photocurable resin composition (parts by mass) | | | | evaluation results of laminate (1 month) | | | | |
|---|---|---|---|---|---|---|---|---|---|
| | Component (A) | Component (B) | Component (C) | another component | appearance | adhesion | adhesion after immersion in boiling water | | |
| | | | | | | | (1H) | (2H) | (3H) |
| Ex. 37 | A-1 (100) | B-1/B-3 (313/87) | C-1 (7.5) | D-1 (0.1) | ○ | A | A | A | A |
| Ex. 38 | A-1 (100) | B-1/B-3 (313/87) | C-1 (7.5) | D-2 (0.4) | ○ | A | A | A | A |
| Ex. 39 | A-1 (100) | B-1/B-3 (313/87) | C-1 (7.5) | D-3 (0.5) | ○ | A | A | A | A |
| Ex. 40 | A-1 (100) | B-1/B-3 (313/87) | C-1 (7.5) | D-4 (0.5) | ○ | A | A | A | A |
| Ex. 41 | A-1 (100) | B-1/B-4 (342/58) | C-1 (7.5) | D-1 (1.0) | ○ | A | A | A | A |
| Ex. 42 | A-1 (100) | B-1/B-3 (313/87) | C-2 (7.5) | D-1 (0.1) | ○ | A | A | A | A |

Ex.: Example

Effect of the Invention

According to the present invention, a cured body (cured film) of a photocurable resin composition free from an appearance defect such as a crack while it has high adhesion to a plastic substrate and a laminate having the cured body can be obtained. It is assumed that the reason that the photocurable resin composition of the present invention has the above effect is that an N-vinyl amide compound contained in the photocurable resin composition of the present invention is dissolved in a part close to the surface of the plastic optical substrate moderately. That is, it is considered that the photocurable resin composition permeates and diffuses into the plastic substrate from the surface and strong mechanical coupling with the plastic substrate is obtained by polymerizing and curing the photocurable resin composition by irradiation in that state. As a result, high adhesion between the cured body (cured film) of the photocurable resin composition and the plastic substrate is obtained.

Further, since the N-vinyl amide compound has a polymerizable group, it seems that volume shrinkage at the time of curing is suppressed, adhesion between the cured body (cured film) of the photocurable resin composition and the plastic substrate is further enhanced, and the production of an appearance defect such as a crack can be suppressed by copolymerizing it with the polyfunctional acrylate monomer which is blended with the N-vinyl amide compound. Since volume shrinkage can be suppressed as described above, the cracking of the cured body (cured film) of the photocurable resin composition can be suppressed as well. Due to this small volume shrinkage, the photocurable resin composition of the present invention is useful as a coating agent for the surface of an optical substrate except for plastic substrates, for example, a substrate made of an inorganic material such as glass.

The invention claimed is:

1. A photocurable resin composition comprising:
   (A) an N-vinyl amide compound represented by the following formula (1):

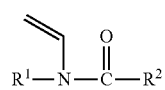
   (1)

wherein $R^1$ and $R^2$ are each independently a hydrogen atom or hydrocarbon group having 1 to 5 carbon atoms, or $R^1$ and $R^2$ may be bonded together to form a hydrocarbon group having 2 to 6 carbon atoms;

(B) a polyfunctional (meth)acrylate monomer represented by the following formula (2):

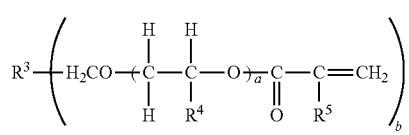
   (2)

wherein $R^4$ and $R^5$ are each independently a hydrogen atom or methyl group, $R^3$ is a trivalent to hexavalent organic residue, "a" is an integer of 0 to 3, and "b" is an integer of 3 to 6;

(C) a photopolymerization initiator; and
   (D) a compound having a 2,2,6,6-tetramethyl-4-piperidyl skeleton and represented by the following formula (4) as a radical scavenger;

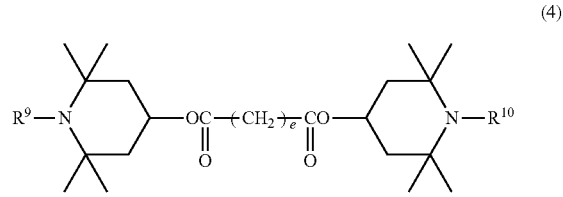
   (4)

wherein $R^9$ and $R^{10}$ are each independently a hydrogen atom or methyl group, and "e" is an integer of 5 to 12.

2. The photocurable resin composition according to claim 1 which comprises 100 to 900 parts by mass of the polyfunctional (meth)acrylate monomer (B) based on 100 parts by mass of the N-vinyl amide compound (A).

3. The photocurable resin composition according to claim 1, wherein the polyfunctional (meth)acrylate monomer (B) comprises a hydroxyl group-containing polyfunctional (meth)acrylate monomer represented by the following formula (3);

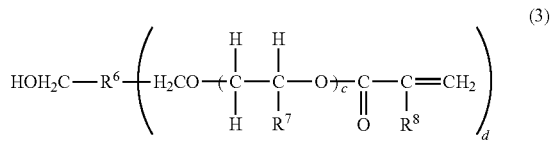
   (3)

wherein $R^7$ and $R^8$ are each independently a hydrogen atom or methyl group, $R^6$ is a tetravalent to hexavalent organic residue, "c" is an integer of 0 to 3, and "d" is an integer of 3 to 5.

4. The photocurable resin composition according to claim 3 which comprises 100 to 900 parts by mass of the polyfunctional (meth)acrylate monomer (B) based on 100 parts by mass of the N-vinyl amide compound (A) and 0.001 to 60 parts by mass of the hydroxyl group-containing polyfunctional (meth)acrylate monomer based on 100 parts by mass of the polyfunctional (meth)acrylate monomer (B).

5. The photocurable resin composition according to claim 1 which comprises 0.005 to 10 parts by mass of (D) a radical scavenger comprising the compound having 2,2,6,6-tetramethyl-4-piperidyl skeleton represented by the above formula (4) based on 100 parts by mass of the total of the above (A) an N-vinyl amide compound and the above (B) a polyfunctional (meth)acrylate monomer.

6. A laminate comprising an optical substrate and a cured film of the photocurable resin composition of claim 1 on the surface of the optical substrate.

7. A laminate comprising a primer layer, a coat layer containing a photochromic compound and a hard coat layer in this order on the cured film of the photocurable resin composition of the laminate of claim 6.

8. The photocurable resin composition according to claim 2, wherein the polyfunctional (meth)acrylate monomer (B) comprises a hydroxyl group-containing polyfunctional (meth)acrylate monomer represented by the following formula (3);

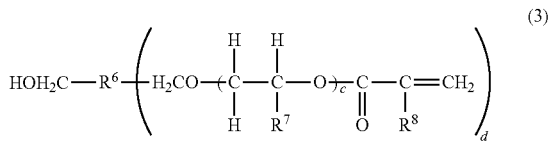

wherein $R^7$ and $R^8$ are each independently a hydrogen atom or methyl group, $R^6$ is a tetravalent to hexavalent organic residue, "c" is an integer of 0 to 3, and "d" is an integer of 3 to 5.

9. The photocurable resin composition according to claim 2 which comprises 100 to 900 parts by mass of the polyfunctional (meth)acrylate monomer (B) based on 100 parts by mass of the N-vinyl amide compound (A) and 0.001 to 60 parts by mass of the hydroxyl group-containing polyfunctional (meth)acrylate monomer based on 100 parts by mass of the polyfunctional (meth)acrylate monomer (B).

10. The photocurable resin composition according to claim 2 which comprises 0.005 to 10 parts by mass of (D) a radical scavenger comprising the compound having 2,2,6,6-tetramethyl-4-piperidyl skelton represented by the above formula (4) based on 100 parts by mass of the total of the above (A) an N-vinyl amide compound and the above (B) a polyfunctional (meth)acrylate monomer.

11. The photocurable resin composition according to claim 3 which comprises 0.005 to 10 parts by mass of (D) a radical scavenger comprising the compound having 2,2,6,6-tetramethyl-4-piperidyl skelton represented by the above formula (4) based on 100 parts by mass of the total of the above (A) an N-vinyl amide compound and the above (B) a polyfunctional (meth)acrylate monomer.

12. The photocurable resin composition according to claim 4 which comprises 0.005 to 10 parts by mass of (D) a radical scavenger comprising the compound having 2,2,6,6-tetramethyl-4-piperidyl skelton represented by the above formula (4) based on 100 parts by mass of the total of the above (A) an N-vinyl amide compound and the above (B) a polyfunctional (meth)acrylate monomer.

13. A laminate comprising an optical substrate and a cured film of the photocurable resin composition of claim 2 on the surface of the optical substrate.

14. A laminate comprising an optical substrate and a cured film of the photocurable resin composition of claim 3 on the surface of the optical substrate.

15. A laminate comprising an optical substrate and a cured film of the photocurable resin composition of claim 4 on the surface of the optical substrate.

16. A laminate comprising an optical substrate and a cured film of the photocurable resin composition of claim 5 on the surface of the optical substrate.

17. A laminate comprising a primer layer, a coat layer containing a photochromic compound and a hard coat layer in this order on the cured film of the photocurable resin composition of the laminate of claim 3.

18. A laminate comprising a primer layer, a coat layer containing a photochromic compound and a hard coat layer in this order on the cured film of the photocurable resin composition of the laminate of claim 4.

19. A laminate comprising a primer layer, a coat layer containing a photochromic compound and a hard coat layer in this order on the cured film of the photocurable resin composition of the laminate of claim 5.

* * * * *